(12) United States Patent
Chen

(10) Patent No.: US 10,747,276 B2
(45) Date of Patent: Aug. 18, 2020

(54) COOLING SYSTEM AND WATER COOLING RADIATOR

(71) Applicant: COOLER MASTER TECHNOLOGY INC., New Taipei (TW)

(72) Inventor: Chen-Wei Chen, New Taipei (TW)

(73) Assignee: COOLER MASTER TECHNOLOGY INC., New Taipei (TW)

( * ) Notice: Subject to any disclaimer, the term of this patent is extended or adjusted under 35 U.S.C. 154(b) by 155 days.

(21) Appl. No.: 16/122,196

(22) Filed: Sep. 5, 2018

(65) Prior Publication Data

US 2019/0377391 A1 Dec. 12, 2019

(30) Foreign Application Priority Data

Jun. 6, 2018 (TW) .............................. 107119414 A

(51) Int. Cl.
| | |
|---|---|
| *G06F 1/20* | (2006.01) |
| *F25B 21/02* | (2006.01) |
| *H01L 23/38* | (2006.01) |
| *H01L 23/427* | (2006.01) |
| *H01L 23/473* | (2006.01) |

(52) U.S. Cl.
CPC ............... *G06F 1/20* (2013.01); *F25B 21/02* (2013.01); *H01L 23/38* (2013.01); *H01L 23/427* (2013.01); *H01L 23/473* (2013.01); *F25B 2321/0252* (2013.01); *G06F 2200/201* (2013.01)

(58) Field of Classification Search
None
See application file for complete search history.

(56) References Cited

U.S. PATENT DOCUMENTS

| | | | | | |
|---|---|---|---|---|---|
| 4,829,771 | A | * | 5/1989 | Koslow ................ | B67D 1/0869 62/3.64 |
| 5,544,487 | A | * | 8/1996 | Attey ....................... | H02K 5/12 62/3.7 |
| 2007/0267741 | A1 | * | 11/2007 | Attlesey ............. | H05K 7/20263 257/714 |
| 2008/0087024 | A1 | * | 4/2008 | Hood ........................ | G06F 1/20 62/3.2 |
| 2008/0169089 | A1 | * | 7/2008 | Wu ....................... | H01L 23/427 165/104.33 |
| 2009/0242182 | A1 | * | 10/2009 | Moreau ................... | F28F 19/00 165/153 |
| 2016/0204486 | A1 | * | 7/2016 | Kenney ............. | H01M 10/6556 429/120 |
| 2017/0315595 | A1 | * | 11/2017 | Kulkarni ................... | G06F 1/20 |
| 2018/0038651 | A1 | * | 2/2018 | Tonellato .............. | F28D 1/0333 |
| 2019/0098799 | A1 | * | 3/2019 | Richards ............ | H05K 7/20863 |

* cited by examiner

*Primary Examiner* — Henry T Crenshaw
(74) *Attorney, Agent, or Firm* — Maschoff Brennan

(57) ABSTRACT

The disclosure provides a water cooling radiator including cold end chamber body, thermoelectric chip, heat dissipating assembly and water tank. The thermoelectric chip has cooling surface and heat-generating surface, and the cooling surface is thermally coupled to the cold end chamber body. The dissipating assembly is thermally coupled to the heat-generating surface. The water tank has first chamber, second chamber, outer inlet, first inner outlet, first inner inlet and outer outlet. The cold end chamber body has a channel, two opposite ends of the channel are respectively connected to the first inner outlet and the first inner inlet, allowing liquid coolant flowing into the first chamber via the outer inlet to flow through the channel and then flow out of the second chamber from the outer outlet.

18 Claims, 10 Drawing Sheets

COOLING SYSTEM AND WATER COOLING RADIATOR

CROSS-REFERENCE TO RELATED APPLICATIONS

This non-provisional application claims priority under 35 U.S.C. § 119(a) on Patent Application No(s). 107119414 filed in R.O.C. Taiwan on Jun. 6, 2018, the entire contents of which are hereby incorporated by reference.

TECHNICAL FIELD

The disclosure relates to a cooling system and a water cooling radiator, more particularly to a cooling system and a water cooling radiator which have a thermoelectric chip.

BACKGROUND

A conventional liquid cooling device mainly includes a thermoelectric chip, a water block, a water pump and a water cooling radiator. The thermoelectric chip has a cold end and a hot end. The cold end of the thermoelectric chip is in thermal contact with a heat source, such as a CPU. The water block is in thermal contact with the hot end of the thermoelectric chip. The water pump is connected to the water block and the water cooling radiator via a pipe.

However, the conventional liquid cooling device has the following problem: since the thermoelectric chip is in tight contact with the heat source, thus the thermoelectric chip will lower the ambient temperature near the heat source below the room temperature and thus produce dew, but the dew is likely to drop onto the heat source or circuit near the heat source to cause a short circuit in electronic device.

SUMMARY

One embodiment of the disclosure provides a water cooling radiator which is configured for liquid coolant to flow therethrough. The water cooling radiator includes a cold end chamber body, at least one thermoelectric chip, at least one heat dissipating assembly and a water tank. The cold end chamber body is configured for liquid coolant to flow therethrough. The at least one thermoelectric chip has a cooling surface and a heat-generating surface which are opposite to each other, and the cooling surface of the at least one thermoelectric chip is thermally coupled to the cold end chamber body. The at least one heat dissipating assembly is thermally coupled to the heat-generating surface of the at least one thermoelectric chip. The water tank has a first chamber, a second chamber, an outer inlet, a first inner outlet, a first inner inlet and an outer outlet, wherein the outer inlet and the first inner outlet correspond to the first chamber, and the first inner inlet and the outer outlet correspond to the second chamber, the cold end chamber body has a channel, two opposite ends of the channel are respectively connected to the first inner outlet of the first chamber and the first inner inlet of the second chamber, allowing liquid coolant flowing into the first chamber via the outer inlet to flow through the channel and then flow out of the second chamber from the outer outlet.

One embodiment of the disclosure provides a cooling system which is configured for liquid coolant to circulate. The cooling system includes a water block and a water cooling radiator. The water block is adapted to be in thermal contact with a heat source. The water cooling radiator is located further away from the heat source than the water block, and the water cooling radiator is connected to the water block via at least one pipe so as to form a cooling circulation for liquid coolant to flow therethrough. The water cooling radiator includes a cold end chamber body, at least one thermoelectric chip, at least one heat dissipating assembly and a water tank. The cold end chamber body is configured for liquid coolant to flow therethrough. The at least one thermoelectric chip has a cooling surface and a heat-generating surface which are opposite to each other, and the cooling surface of the thermoelectric chip is thermally coupled to the cold end chamber body. The at least one heat dissipating assembly is thermally coupled to the heat-generating surface of the thermoelectric chip. The water tank has a first chamber, a second chamber, an outer inlet, a first inner outlet, a first inner inlet and an outer outlet, wherein the outer inlet and the first inner outlet correspond to the first chamber, the first inner inlet and the outer outlet correspond to the second chamber, the cold end chamber body has a channel, two opposite ends of the channel are respectively connected to the first inner outlet of the first chamber and the first inner inlet of the second chamber, allowing liquid coolant flowing into the first chamber via the outer inlet to flow through the channel and then flow out of the second chamber from the outer outlet.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
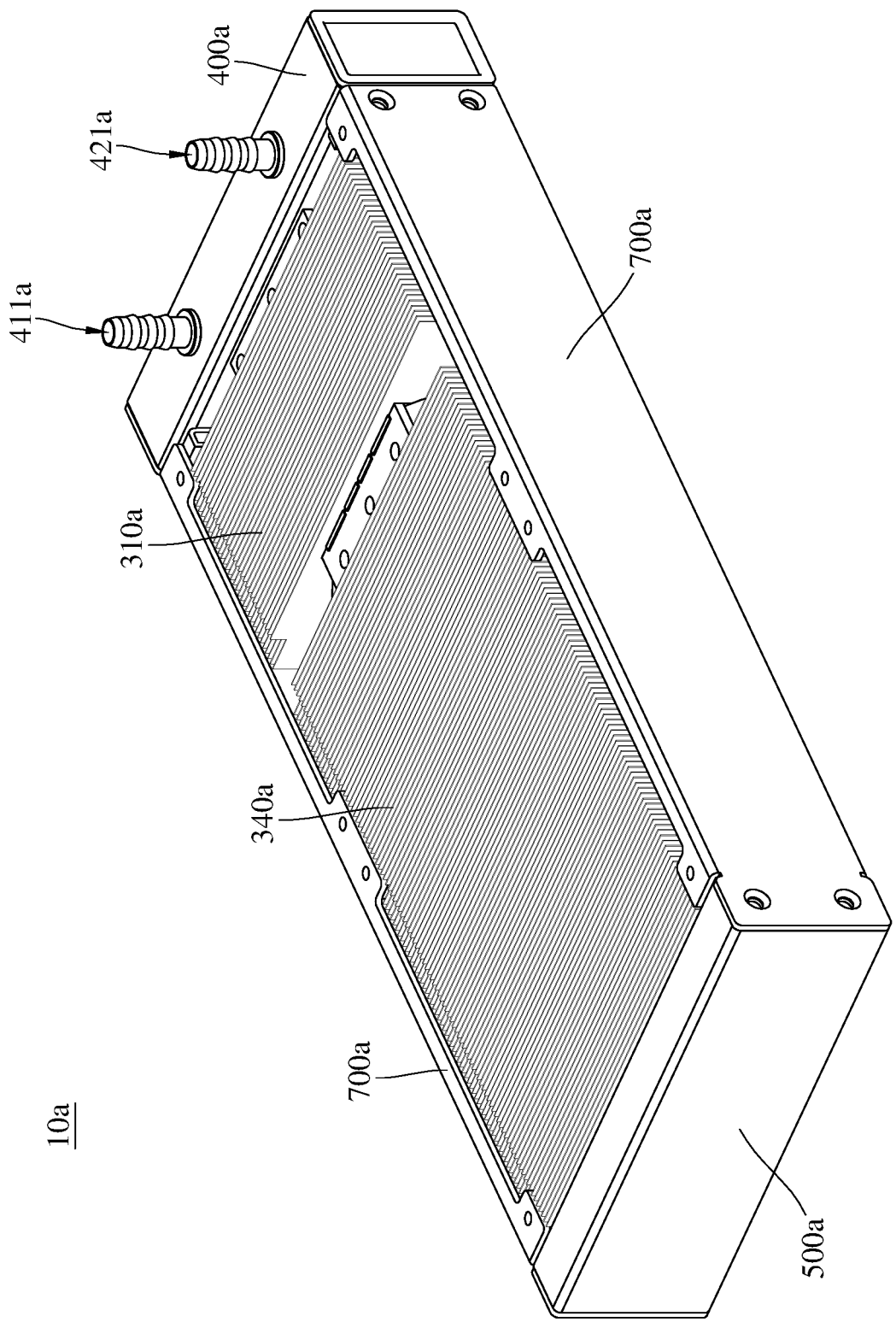
FIG. 1 is a perspective view of a water cooling radiator according to a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known main structures and devices are schematically shown in order to simplify the drawing.

Moreover, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained unless the terms have a specific meaning in the present disclosure.

Figure 2:
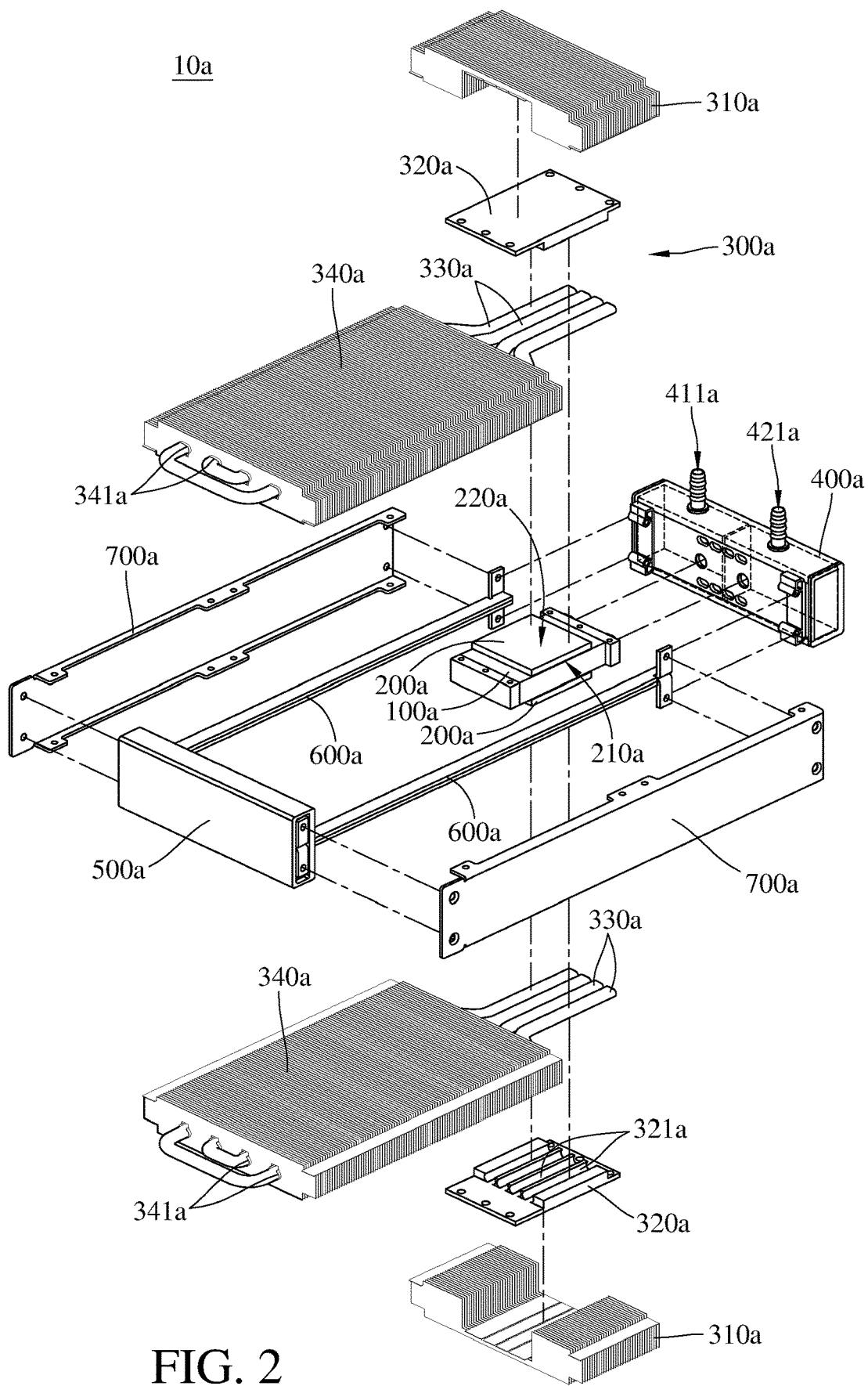
FIG. 2 is an exploded view of the water cooling radiator in FIG. 1.
Figure 3:
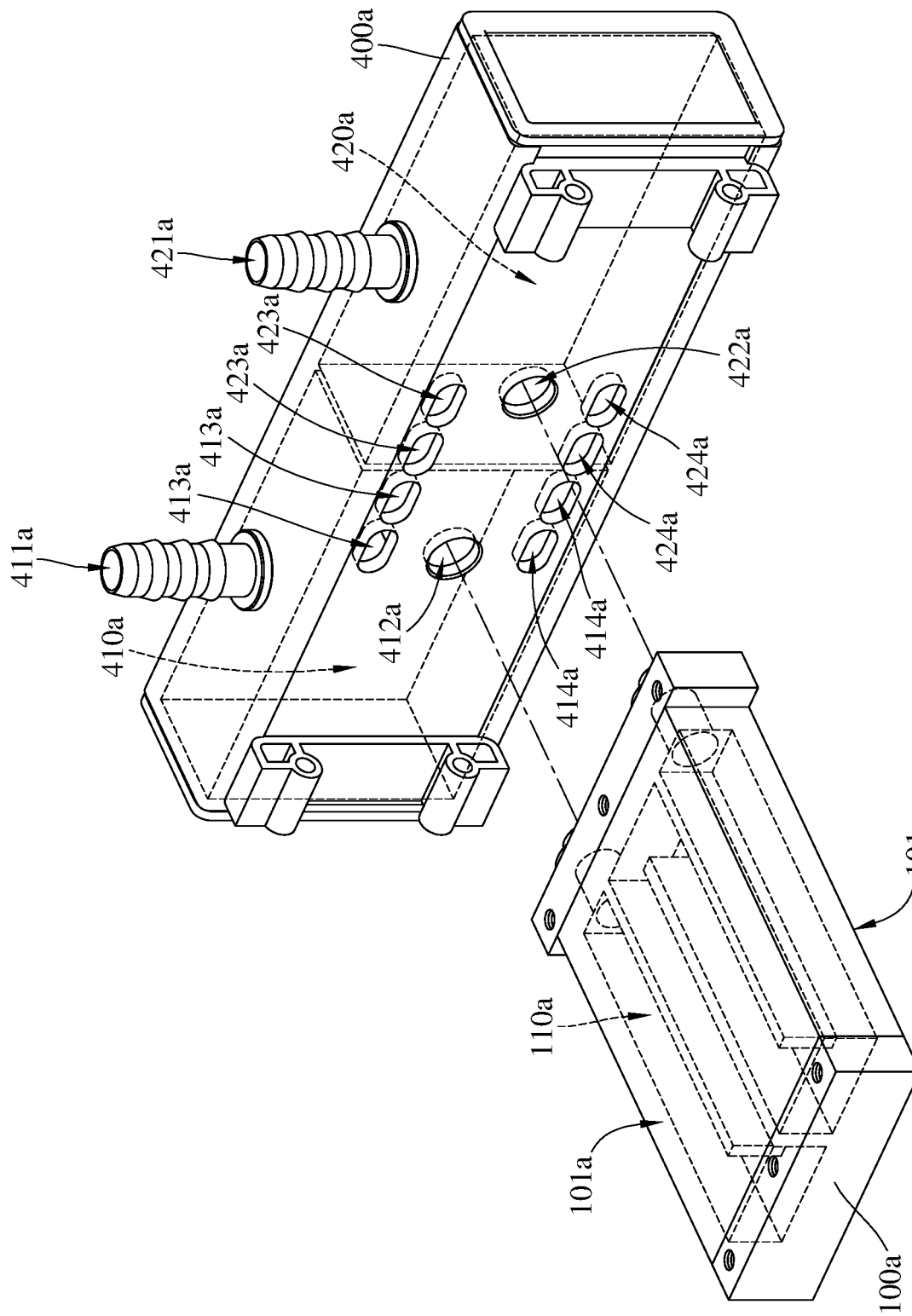
FIG. 3 is a partially enlarged view of the water cooling radiator in FIG. 2.

Please refer to FIGS. 1 to 3. FIG. 1 is a perspective view of a water cooling radiator according to a first embodiment of the present disclosure, FIG. 2 is an exploded view of the water cooling radiator in FIG. 1, and FIG. 3 is a partially enlarged view of the water cooling radiator in FIG. 2.

This embodiment provides a water cooling radiator 10a which allows liquid coolant (not shown) to flow therethrough so as to cool the liquid coolant. The water cooling radiator 10a includes a cold end chamber body 100a, two thermoelectric chips 200a and two heat dissipating assemblies 300a. The cold end chamber body 100a has a channel 110a. One end of the channel 110a is able to receive the liquid coolant flowing through a heat source (not shown), such that the liquid coolant is able to flow through the channel 110a and to be cooled by the cold end chamber body 100a and then to be discharged out of another end of the channel 110a. The two thermoelectric chips 200a each have a cooling surface 210a and a heat-generating surface 220a which are opposite to each other. The cooling surfaces 210a of the two thermoelectric chips 200a are respectively thermally coupled to two opposite thermal contact surfaces 101a of the cold end chamber body 100a. The two heat dissipating assemblies 300a are respectively thermally coupled to the two heat-generating surfaces 220a of the two thermoelectric chips 200a so as to cool the thermoelectric chips 200a.

The water cooling radiator 10a further includes a water tank 400a. The water tank 400a has a first chamber 410a, a second chamber 420a, an outer inlet 411a corresponding to the first chamber 410a, a first inner outlet 412a, a plurality of second inner outlets 413a, a plurality of third inner outlets 414a, a first inner inlet 422a corresponding to the second chamber 420a, a plurality of second inner inlets 423a, a plurality of third inner inlets 424a, and an outer outlet 421a. The two opposite ends of the channel 110a of the cold end chamber body 100a are respectively connected to the first inner outlet 412a of the first chamber 410a and the first inner inlet 422a of the second chamber 420a, such that the liquid coolant is able to flow into the first chamber 410a from the outer inlet 411a to flow through the channel 110a and then to be discharged out of the second chamber 420a via the outer outlet 421a.

Each heat dissipating assembly 300a includes a first heat dissipation fin 310a, a heat conductive seat 320a, a plurality of pipes 330a, and a second heat dissipation fin 340a. The two heat conductive seats 320a are respectively thermally coupled to the two heat-generating surfaces 220a of the two thermoelectric chips 200a. The two first heat dissipation fins 310a are respectively thermally coupled to the two heat-generating surfaces 220a of the two thermoelectric chips 200a via the two heat conductive seats 320a, but the present disclosure is not limited thereto. For example, in some other embodiments, fins may be directly formed on a side of the heat conductive seat by utilizing cutting tools and a controlled slicing technique or another process, such as an aluminum extrusion process or metal casting process. The pipes 330a are thermally coupled to the two heat conductive seats 320a. For example, the pipes 330a are respectively tightly engaged in grooves 321a on the heat conductive seat 320a. Also, the pipes 330a are thermally coupled to the second heat dissipation fin 340a. For example, the pipes 330a are respectively tightly inserted into through holes 341a of the second heat dissipation fin 340a. On one of the heat dissipating assemblies 300a, two opposite ends of one of the pipes 330a are respectively connected to one of the second inner outlets 413a and one of the second inner inlets 423a, and two opposite ends of the other pipe 330a are respectively connected to the other second inner outlet 413a and the other second inner inlet 423a. On the other heat dissipating assembly 300a, two opposite ends of one of the pipes 330a are respectively connected to one of the third inner outlets 414a and one of the third inner inlets 424a, and two opposite ends of the other pipe 330a are respectively connected to the other third inner outlet 414a and the other third inner inlet 424a. In other words, the liquid coolant flowing in the first chamber 410a from the outer inlet 411a is able to flow through the pipes 330a and then to be discharged out of the second chamber 420a via the outer outlet 421a. The detail operation is explained in the following paragraphs.

In this embodiment, the quantities of the first inner outlets 412a, the second inner outlets 413a, the third inner outlets 414a, the first inner inlets 422a, the second inner inlets 423a and the third inner inlets 424a are plural, but the present disclosure is not limited thereto. In some other embodiments, the quantities of the first inner outlet 412a, the second inner outlet 413a, the third inner outlet 414a, the first inner inlet 422a, the second inner inlet 423a and the third inner inlet 424a may each be one.

In addition, in this embodiment, there are two thermoelectric chips 200a and two heat dissipating assemblies 300a, but the present disclosure is not limited thereto. In some other embodiments, there may be only one thermoelectric chip 200a and one heat dissipating assembly 300a, and the water tank may accordingly remove the third inner outlet 414a and the third inner inlet 424a.

In addition, the water cooling radiator 10a further includes a rear plate 500a, two connecting components 600a and two side plates 700a. The cold end chamber body 100a, at least one thermoelectric chip 200a and at least one heat dissipating assembly 300a are located between the water tank 400a and the rear plate 500a. The two connecting components 600a are opposite to each other and connected between the water tank 400a and the rear plate 500a. The side plates 700a are respectively connected to the two connecting components 600a. And the side plates 700a are respectively connected to two opposite sides of the rear plate 500a.

Figure 4:
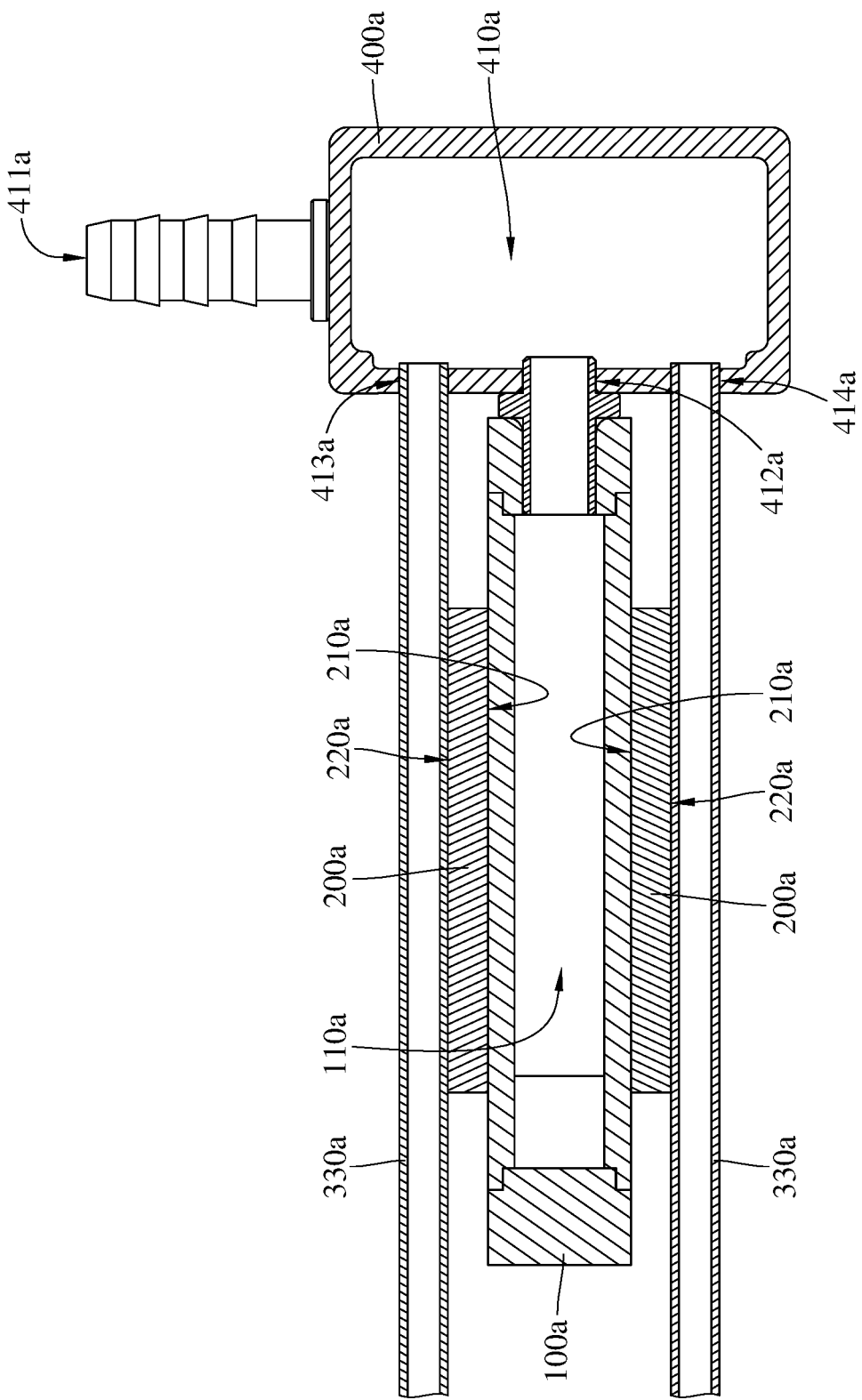
FIG. 4 is a partially enlarged cross-sectional view of the water cooling radiator in FIG. 1.
Figure 5:
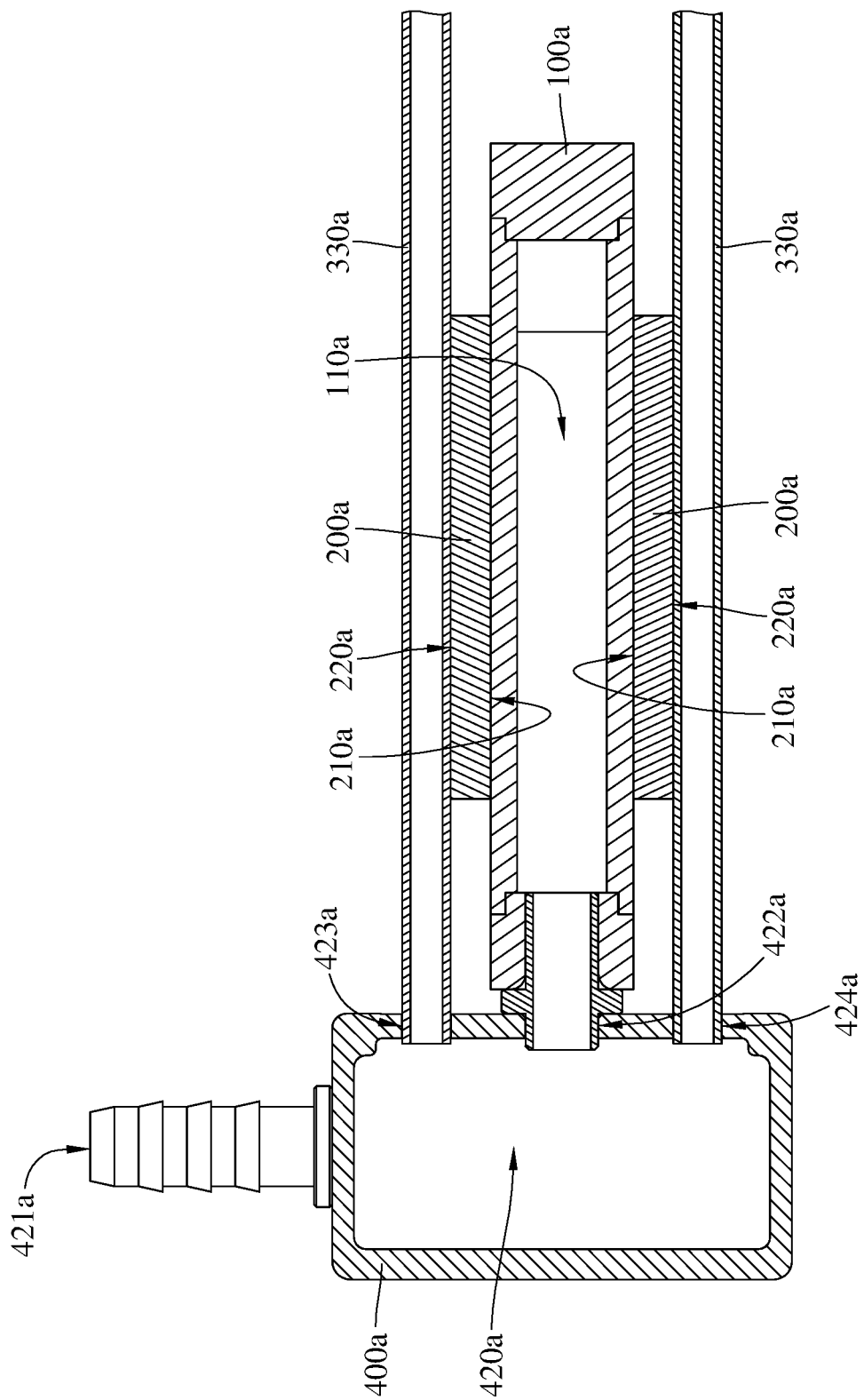
FIG. 5 is another partially enlarged cross-sectional view of the water cooling radiator in FIG. 1.

Please refer to FIGS. 3 to 5. FIG. 4 is a partially enlarged cross-sectional view of the water cooling radiator in FIG. 1, and FIG. 5 is another partially enlarged cross-sectional view of the water cooling radiator in FIG. 1.

First is to illustrate the cooling circulation for cooling the heat source, as shown in FIGS. 3 and 4, the liquid coolant heated by the heat source flows into the first chamber 410a via the outer inlet 411a, and then flows into the channel 110a of the cold end chamber body 100a via the first inner outlet 412a. If the temperature of the liquid coolant reaches to a certain level that requires the thermoelectric chip 200a to operate, the thermoelectric chip 200a will be activated to cool the liquid coolant. Then, as shown in FIGS. 3 and 5, the liquid coolant cooled by the thermoelectric chip 200a flows into the second chamber 420a via the first inner inlet 422a, and then flows back to the heat source via the outer outlet 421a so as to form a cooling circulation. Therefore, by the thermoelectric chip 200a, the water cooling radiator 10a is able to cool the liquid coolant (work liquid) down to below the room temperature (e.g., the temperature of the liquid coolant is lowered by approximately 4 to 6 degrees Celsius) so as to improve the cooling effect of the liquid coolant.

Then, the waste heat caused by the operation of the thermoelectric chips 200a is conducted to the two heat dissipating assemblies 300a from the heat-generating surfaces 220a and dissipated by the two heat dissipating assemblies 300a. Then, as shown in FIGS. 3 and 4, the liquid coolant heated by the heat source will flow into the channel 110a of the cold end chamber body 100a via the first chamber 410a, and will also flow into the pipes 330a via the second inner outlets 413a and the third inner outlets 414a of the first chamber 410a and then flow into the second chamber 420a via the second inner inlets 423a and the third inner inlets 424a and thus to form a cooling circulation for cooling the thermoelectric chip 200a. Since the temperature of the liquid coolant which is heated by the heat source is still lower than that of the heat-generating surface 220a of the thermoelectric chip 200a, the liquid coolant flowing through the pipes 330a is able to cool the thermoelectric chip 200a so as to improve the cooling effect of the heat dissipating assembly 300a for cooling the thermoelectric chip 200a and thereby extending or improving the cooling effect of the thermoelectric chip 200a. In addition, the liquid coolant flowing through the heat source flows through the pipes 330a of the heat dissipating assemblies 300a, such that the two heat dissipating assemblies 300a are able to preliminarily cool the liquid coolant flowing through the heat source.

As discussed above, by the water tank 400a cooperating the pipes 330a of the two heat dissipating assemblies 300a, there is no need to additionally equip a water cooling radiator for cooling the thermoelectric chip 200a and thus the overall size of the water cooling radiator 10a is decreased. In addition, when the thermoelectric chip 200a is not in operation, the two heat dissipating assemblies 300a still able to cool the liquid coolant flowing through the heat source. That is, if the thermoelectric chip 200a is malfunction or not yet activated, the liquid coolant flowing through the heat source still can be cooled by the heat dissipating assemblies 300a, the cooling effect is the same as a regular water cooling radiator.

Figure 6:
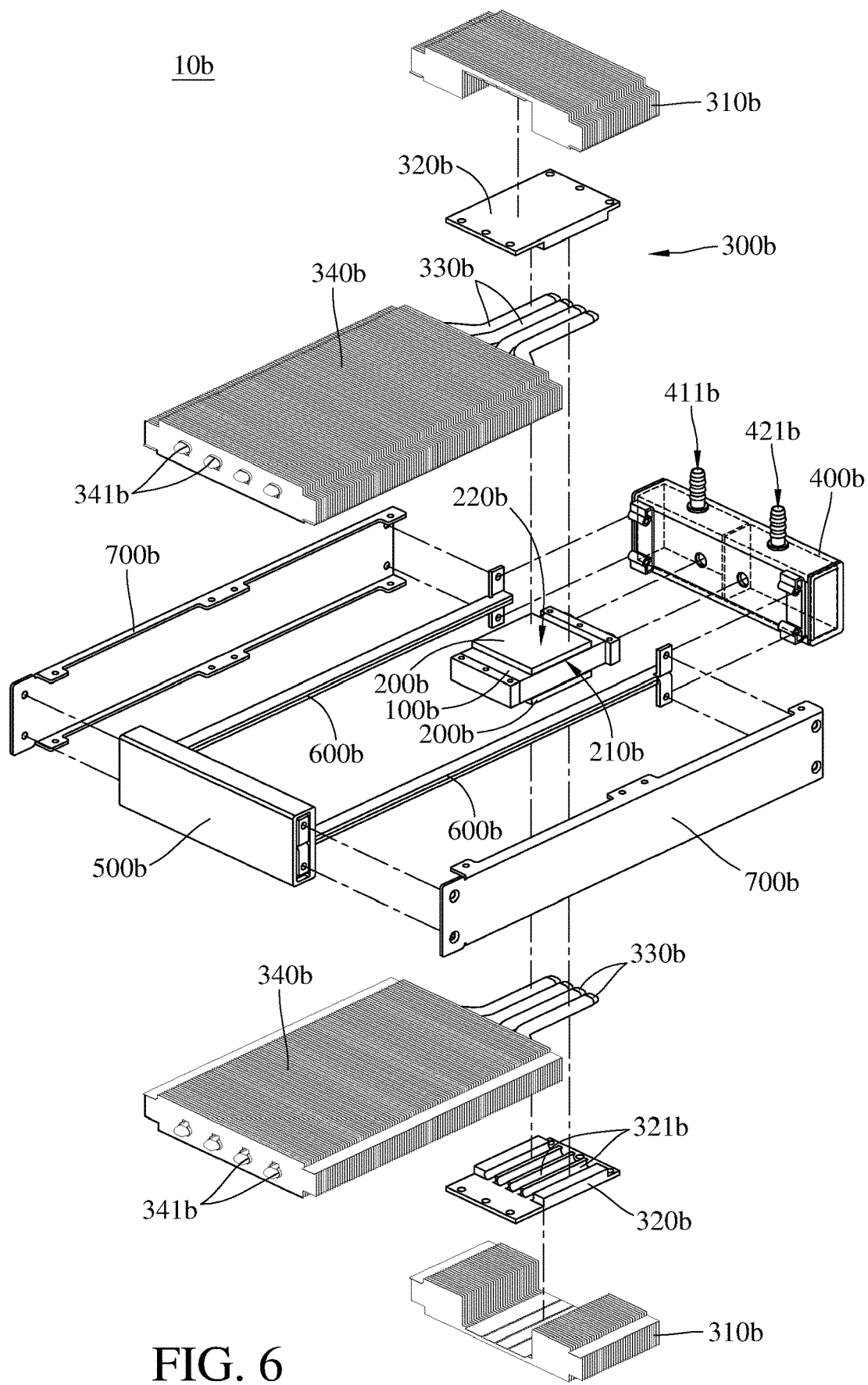
FIG. 6 is an exploded view of a water cooling radiator according to a second embodiment of the present disclosure.
Figure 7:
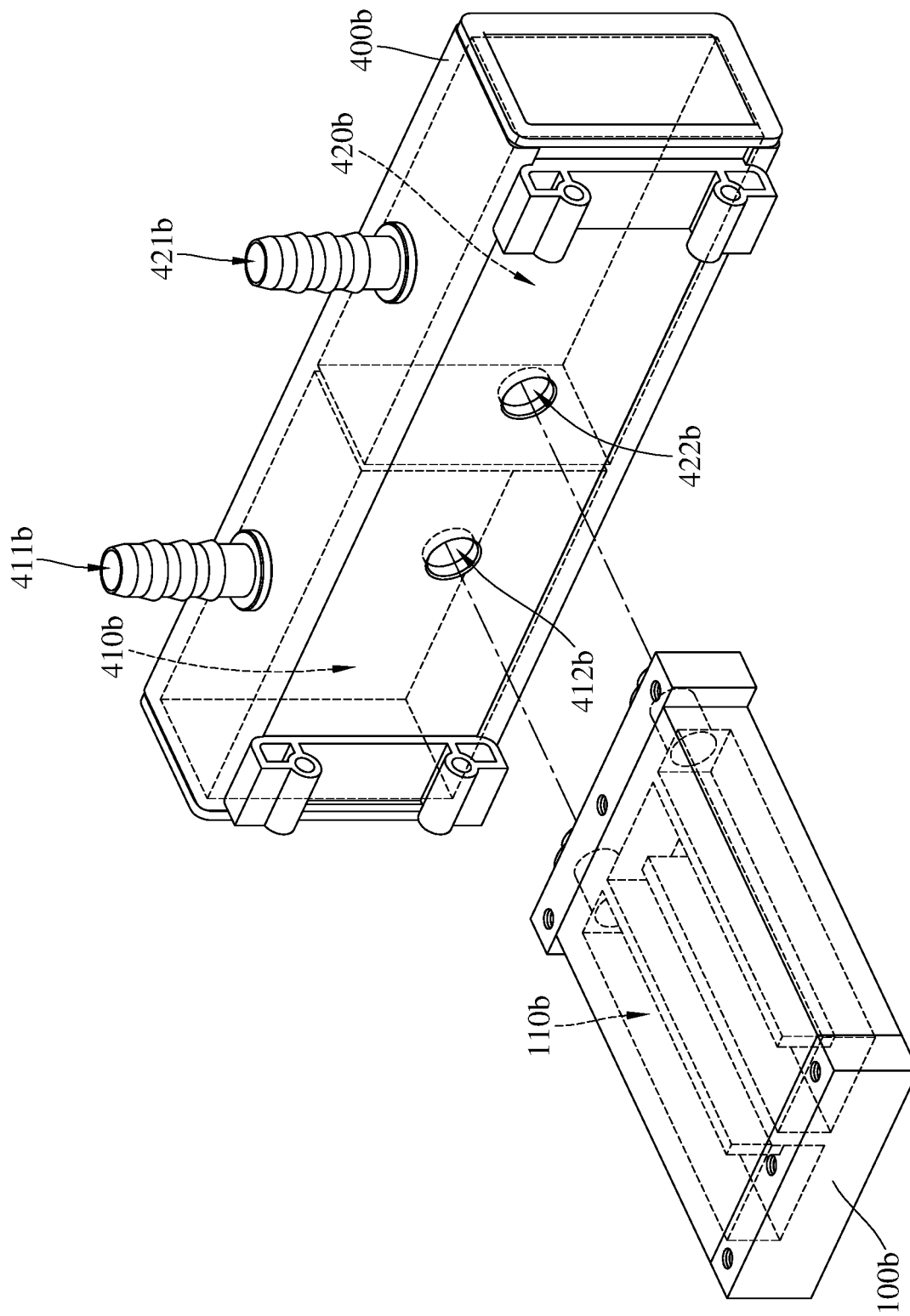
FIG. 7 is a partially enlarged view of the water cooling radiator in FIG. 6.

In the previous embodiments, the heat dissipating assembly 300a conducts heat to the heat dissipation fin 310a through the pipes 330a, but the present disclosure is not limited thereto. Please refer to FIGS. 6 and 7, FIG. 6 is an exploded view of a water cooling radiator according to a second embodiment of the present disclosure, and FIG. 7 is a partially enlarged view of the water cooling radiator in FIG. 6.

This embodiment provides a water cooling radiator 10b which allows liquid coolant to flow therethrough so as to cool the liquid coolant. The water cooling radiator 10b includes a cold end chamber body 100b, two thermoelectric chips 200b, and two heat dissipating assemblies 300b. The cold end chamber body 100b has a channel 110b. One end of the channel 110b is able to receive the liquid coolant from a heat source (not shown), such that the liquid coolant is able to flow through the channel 110b and to be cooled by the cold end chamber body 100b and then to be discharged out of another end of the channel 110b. The two thermoelectric chips 200b each have a cooling surface 210b and a heat-generating surface 220b which are opposite to each other. The cooling surfaces 210b of the thermoelectric chips 200b are respectively thermally coupled to two opposite thermal contact surfaces 101b of the cold end chamber body 100b. The two heat dissipating assemblies 300b are respectively thermally coupled to the two heat-generating surfaces 220b of the two thermoelectric chips 200b so as to cool the thermoelectric chips 200b.

In this embodiment, the water cooling radiator 10b further includes a water tank 400b. The water tank 400b has a first chamber 410b, a second chamber 420b, an outer inlet 411b and a first inner outlet 412b which correspond to the first chamber 410b, and a first inner inlet 422b and an outer outlet 421b which correspond to the second chamber 420b. Two opposite ends of the channel 110b of the cold end chamber body 100b are respectively connected to the first inner outlet 412b of the first chamber 410b and the first inner inlet 422b of the second chamber 420b, such that the liquid coolant is able to flow into the first chamber 410b via the outer inlet 411b, then flow through the channel 110b, and then flow out of the second chamber 420b via the outer outlet 421b.

Each heat dissipating assembly 300b includes a first heat dissipation fin 310b, a heat conductive seat 320b, a plurality of heat pipes 330b, and a second heat dissipation fin 340b. The two heat conductive seats 320b are respectively thermally coupled to the two heat-generating surfaces 220b of the two thermoelectric chips 200b. The two first heat dissipation fins 310b are respectively thermally coupled to the two heat-generating surfaces 220b of the two thermoelectric chips 200b via the two heat conductive seats 320b, but the present disclosure is not limited thereto. For example, in some other embodiments, fins may be directly formed on a side of the heat conductive seat by utilizing cutting tools and a controlled slicing technique or another process, such as an aluminum extrusion process or metal casting process. The heat pipes 330b are respectively thermally coupled to the two heat conductive seats 320b. For example, the heat pipes 330b are respectively tightly engaged in grooves 321b on the heat conductive seat 320b. Also, the heat pipes 330b are respectively thermally coupled to second heat dissipation fins 340b. For example, the heat pipes 330b are respectively tightly inserted into through holes 341b of the second heat dissipation fin 340b. On one of the heat dissipating assemblies 300b, two opposite ends of one of the heat pipes 330b are respectively thermally coupled to one of the heat conductive seats 320b and one of the second heat dissipation fins 340b, and two opposites ends of the other heat pipe 330b are respectively thermally coupled to the other heat conductive seat 320b and the other thermally coupled to the other second heat dissipation fin 340b. In other words, the liquid coolant flowing into the first chamber 410b via the outer inlet 411b only will flow through the channel 110b of the cold end chamber body 100b but not flow through the heat dissipating assembly 300b.

In addition, in this embodiment, the quantities of both the thermoelectric chips 200b and the heat dissipating assemblies 300b are two, but the present disclosure is not limited thereto. In some other embodiments, there may be only one thermoelectric chip 200b and one heat dissipating assembly 300b, and the water tank may accordingly remove the third inner outlet 414b and the third inner inlet 424b.

In this embodiment, the water cooling radiator 10b further includes a rear plate 500b, two connecting components 600b and two side plates 700b. The cold end chamber body 100b, at least one thermoelectric chip 200b and at least one heat dissipating assembly 300b are located between the water tank 400b and the rear plate 500b. The two connecting component 600b are opposite to each other and connected between the water tank 400b and the rear plate 500b. The side plates 700b are respectively connected to the two connecting components 600b. And the side plates 700b are respectively connected to two opposite sides of the rear plate 500b.

Figure 8:
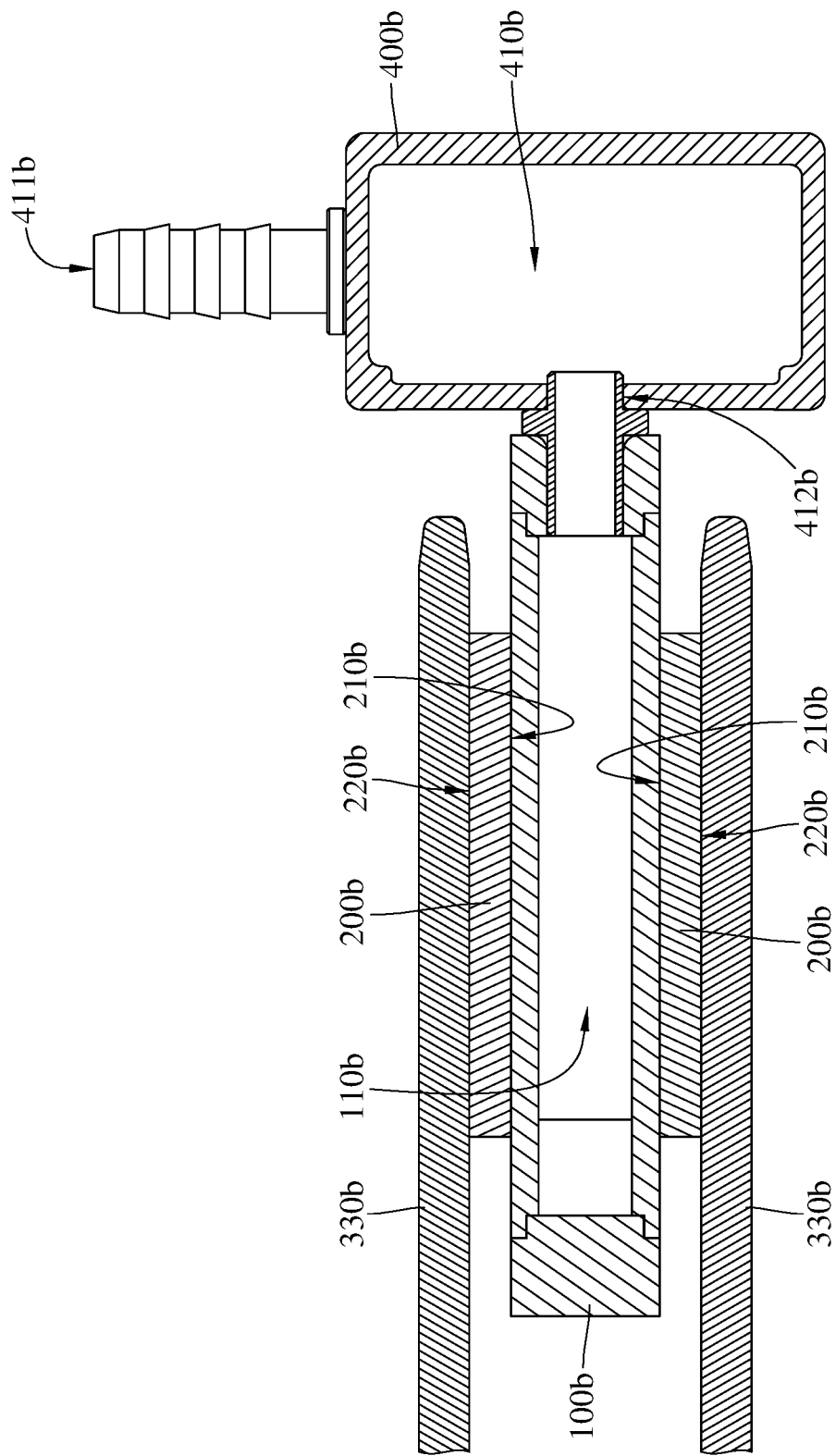
FIG. 8 is a partially enlarged cross-sectional view of the water cooling radiator according to the second embodiment of the present disclosure.
Figure 9:
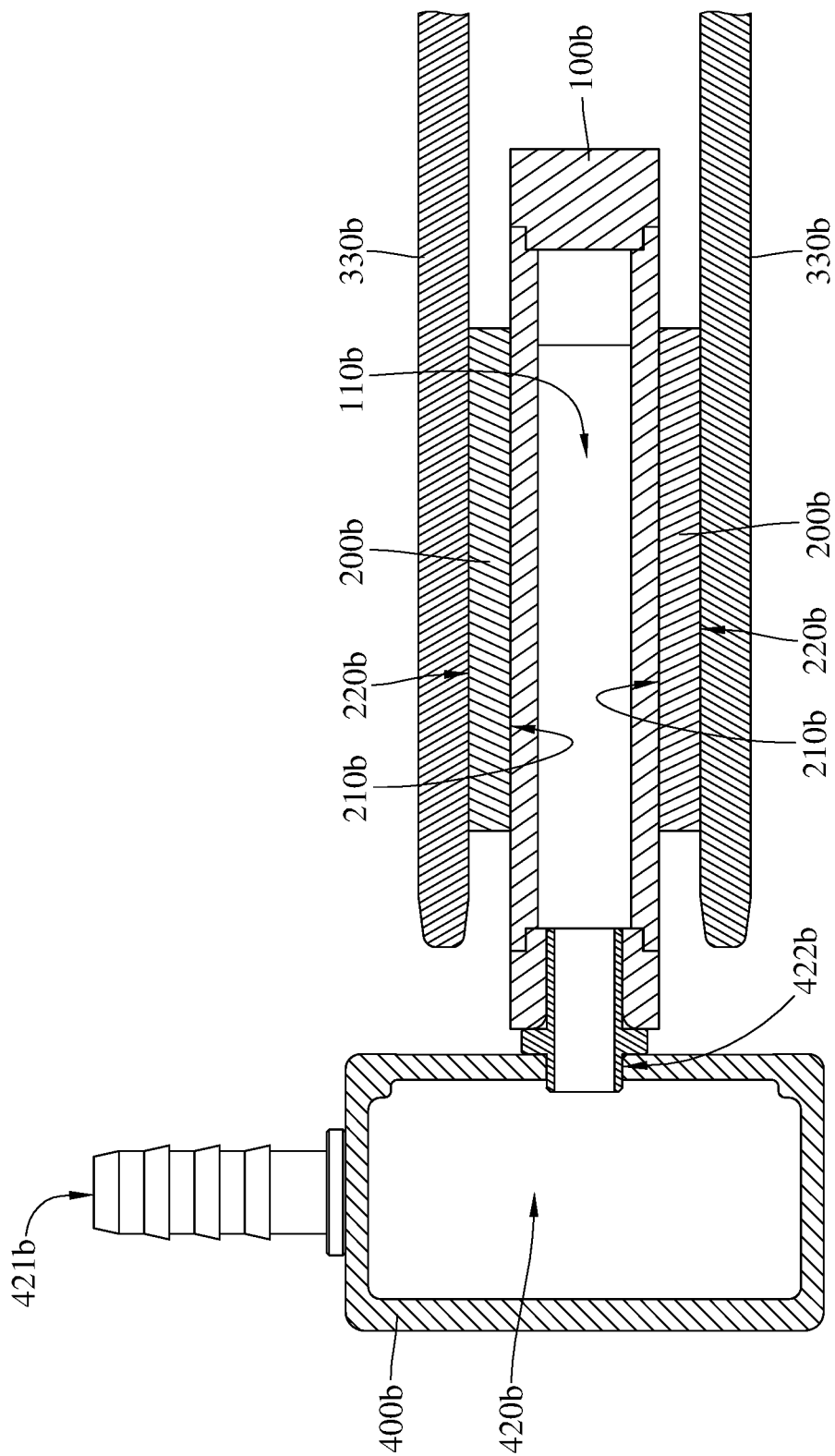
FIG. 9 is another partially enlarged cross-sectional view of the water cooling radiator according to the second embodiment of the present disclosure.

Please refer to FIGS. 6, 8 and 9, FIG. 8 is a partially enlarged cross-sectional view of the water cooling radiator according to the second embodiment of the present disclosure, and FIG. 9 is another partially enlarged cross-sectional view of the water cooling radiator according to the second embodiment of the present disclosure.

First is to illustrate the cooling circulation for cooling the heat source, as shown in FIGS. 6 and 8, the liquid coolant heated by the heat source flows into the first chamber 410b via the outer inlet 411b, and then flows into the channel 110b of the cold end chamber body 100b via the first inner outlet 412b. If the temperature of the liquid coolant reaches to a certain level that requires the thermoelectric chip 200b to operate, the thermoelectric chip 200b will be activated to cool the liquid coolant. Then, as shown in FIGS. 6 and 9, the liquid coolant cooled by the thermoelectric chip 200b flows into the second chamber 420b via the first inner inlet 422b, and then flows back to the heat source via the outer outlet 421b so as to form a cooling circulation. Therefore, by the thermoelectric chip 200b, the water cooling radiator 10b is able to cool the liquid coolant (work liquid) down to below the room temperature (e.g., the temperature of the liquid coolant is lowered by approximately 4 to 6 degrees Celsius) so as to improve the cooling effect of the liquid coolant.

Then, the waste heat caused by the operation of the thermoelectric chips 200b is conducted to the two heat dissipating assemblies 300b from the heat-generating surfaces 220b and dissipated by the two heat dissipating assemblies 300b. However, the heat pipes 330b equipped on the heat dissipating assembly 300b have no liquid coolant to flow therethrough, thus the liquid coolant can be cooled down to below the room temperature by another regular water cooling radiator to improve the cooling effect of the thermoelectric chip 200b for cooling the liquid coolant.

Figure 10:
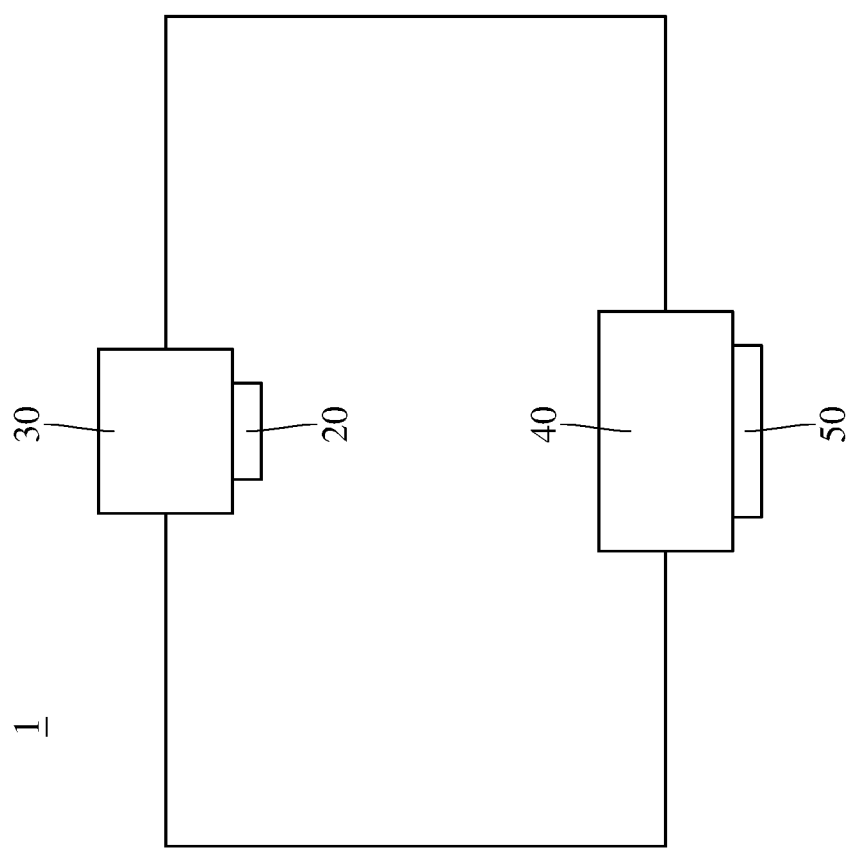
FIG. 10 shows a cooling system according to a third embodiment of the present disclosure.

The present disclosure is not limited to the configuration of the water cooling radiator 10b, any configuration, that a thermoelectric chip is disposed at the cold end of the cooling system, falls within the scope of the present disclosure. Please refer to FIG. 10, FIG. 10 shows a cooling system according to a third embodiment of the present disclosure.

In this embodiment, a cooling system 1 is configured to cool a heat source 20. The cooling system 1 includes a water block 30, a water cooling radiator 40 and a thermoelectric chip 50. The water block 30 is thermally coupled to the heat source 20, the water cooling radiator 40 is further away from the heat source 20 than the water block 30, and the water cooling radiator 40 is connected to the water block 30 via pipe(s) and thus to form a cooling circulation. The thermoelectric chip 50 is disposed on the water cooling radiator 40 and is configured to cool the liquid coolant flowing through the water cooling radiator 40. The thermoelectric chip 50 is disposed on the water cooling radiator 40 which is away from the heat source 20, meaning that the thermoelectric chip 50 is disposed at a cold end of the cooling system 1 instead of being disposed at the hot end of the cooling system 1, such that when the thermoelectric chip 50 causes low temperature and thus cause dew, the dew would not drop onto the heat source 20 and to cause short-circuit of the heat source 20.

According to the cooling system and the water cooling radiator as discussed in above, the thermoelectric chip is disposed on the water cooling radiator which is located away from the heat source, meaning that the thermoelectric chip is disposed at the cold end of the cooling system instead of being disposed at the hot end of the cooling system, such that when the thermoelectric chip causes the temperature of the liquid coolant to lower than the room temperature and thus cause dew, the dew would not drop onto the heat source to cause short-circuit of the heat source.

In addition, the temperature of the liquid coolant heated by the heat source is still lower than that of the heat-generating surface of the thermoelectric chip, thus the liquid coolant flowing through the pipe is able to cool the thermoelectric chip so as to improve the cooling effect of the heat dissipating assembly for cooling the thermoelectric chip, thereby improving the cooling effect of the thermoelectric chip. Moreover, the liquid coolant flowing through the heat source flows through the pipes of the two heat dissipating assemblies, such that the two heat dissipating assemblies are able to preliminarily cool the liquid coolant flowing through the heat source.

Furthermore, the liquid coolant of the cooling system can flow into the pipes, which are disposed through the heat dissipating assembly, via the water tank, thus the liquid coolant is able to cool the thermoelectric chip. As a result, there is no need to additionally equip a cooling radiator on the water cooling radiator for cooling the thermoelectric chip, and thus the overall size of the water cooling radiator can be decreased.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A water cooling radiator, configured for liquid coolant to flow therethrough, comprising:
    a cold end chamber body, configured for liquid coolant to flow therethrough;
    at least one thermoelectric chip, having a cooling surface and a heat-generating surface which are opposite to each other, and the cooling surface of the at least one thermoelectric chip being thermally coupled to the cold end chamber body;
    at least one heat dissipating assembly, comprising a first heat dissipation fin, a heat conductive seat, at least one pipe, and a second heat dissipation fin, wherein the heat conductive seat is thermally coupled to the heat-generating surface of the at least one thermoelectric chip, the first heat dissipation fin is thermally coupled to the heat-generating surface of the at least one thermoelectric chip via the heat conductive seat, the at least one pipe is thermally coupled to the heat conductive seat, and the second heat dissipation fin is thermally coupled to the heat conductive seat via the at least one pipe; and
    a water tank, having a first chamber, a second chamber, an outer inlet, a first inner outlet, a first inner inlet and an outer outlet, wherein the outer inlet and the first inner outlet correspond to the first chamber, and the first inner inlet and the outer outlet correspond to the second chamber, the cold end chamber body has a channel, two opposite ends of the channel are respectively connected to the first inner outlet of the first chamber and the first inner inlet of the second chamber, allowing liquid coolant flowing into the first chamber via the outer inlet to flow through the channel and then flow out of the second chamber from the outer outlet.

2. The water cooling radiator according to claim 1, wherein the at least one pipe comprises a plurality of heat pipes, one end of the plurality of heat pipes is thermally coupled to the heat conductive seat, and another end of the plurality of heat pipes is thermally coupled to the second heat dissipation fin.

3. The water cooling radiator according to claim 2, wherein the cold end chamber body has two thermal contact surfaces opposite to each other, the quantity of the at least one thermoelectric chip is two, the cooling surfaces of the two thermoelectric chips are respectively in contact with the two thermal contact surfaces, the quantity of the at least one heat dissipating assembly is two, the heat conductive seats of the two heat dissipating assemblies are respectively thermally coupled to the two heat-generating surfaces.

4. The water cooling radiator according to claim 1, wherein the water tank further has at least one second inner outlet and at least one second inner inlet, the at least one second inner outlet corresponds to the first chamber, the at least one second inner inlet corresponds to the second chamber, one end of the at least one pipe is connected to the at least one second inner outlet, and another end of the at least one pipe is connected to the at least one second inner inlet.

5. The water cooling radiator according to claim 4, wherein the quantities of the at least one second inner outlet, the at least one second inner inlet and the at least one pipe are each two.

6. The water cooling radiator according to claim 4, wherein the water tank further has at least one third inner outlet and at least one third inner inlet, the at least one third inner outlet corresponds to the first chamber, the at least one third inner inlet corresponds to the second chamber, the quantity of the at least one heat dissipating assembly is two, two opposite ends of the pipe of one of the two heat dissipating assemblies are respectively connected to the second inner outlet and the second inner inlet, two opposite ends of the pipe of the other heat dissipating assembly are respectively connected to the at least one third inner outlet and the at least one third inner inlet.

7. The water cooling radiator according to claim 4, wherein the quantities of the at least one second inner outlet, the at least one second inner inlet, the at least one third inner outlet, the at least one third inner inlet and the at least one pipe of the at least one heat dissipating assembly are each two.

8. The water cooling radiator according to claim 1, further comprising a rear plate and two connecting components, the cold end chamber body, the at least one thermoelectric chip and the at least one heat dissipating assembly being located between the water tank and the rear plate, the two connecting components being respectively connected to two opposite sides of the water tank and being respectively connected to two opposite sides of the rear plate.

9. The water cooling radiator according to claim 8, further comprising two side plates which are respectively connected to the two connecting components, and the two side plates being respectively connected to two opposite sides of the rear plate.

10. A cooling system, configured for liquid coolant to circulate, the cooling system comprising:
a water block, adapted to be in thermal contact with a heat source; and
a water cooling radiator, being located further away from the heat source than the water block, and the water cooling radiator being connected to the water block via at least one pipe so as to form a cooling circulation for liquid coolant to flow therethrough;
wherein, the water cooling radiator comprises:

a cold end chamber body which is configured for liquid coolant to flow therethrough;
at least one thermoelectric chip which has a cooling surface and a heat-generating surface which are opposite to each other, and the cooling surface of the thermoelectric chip is thermally coupled to the cold end chamber body;
at least one heat dissipating assembly comprising a first heat dissipation fin, a heat conductive seat, at least one pipe, and a second heat dissipation fin, wherein the heat conductive seat is thermally coupled to the heat-generating surface of the at least one thermoelectric chip, the first heat dissipation fin is thermally coupled to the heat-generating surface of the at least one thermoelectric chip via the heat conductive seat, the at least one pipe is thermally coupled to the heat conductive seat, and the second heat dissipation fin is thermally coupled to the heat conductive seat via the at least one pipe; and
a water tank, the water tank which has a first chamber, a second chamber, an outer inlet, a first inner outlet, a first inner inlet and an outer outlet, wherein the outer inlet and the first inner outlet correspond to the first chamber, the first inner inlet and the outer outlet correspond to the second chamber, the cold end chamber body has a channel, two opposite ends of the channel are respectively connected to the first inner outlet of the first chamber and the first inner inlet of the second chamber, allowing liquid coolant flowing into the first chamber via the outer inlet to flow through the channel and then flow out of the second chamber from the outer outlet.

11. The cooling system according to claim 10, wherein the at least one pipe comprises a plurality of heat pipes, one end of the plurality of heat pipes is in thermal contact with the heat conductive seat, and another end of the plurality of heat pipes is in thermal contact with the second heat dissipation fin.

12. The cooling system according to claim 11, wherein the cold end chamber body has two thermal contact surfaces opposite to each other, the quantity of the at least one thermoelectric chip is two, the cooling surfaces of the two thermoelectric chips are respectively in contact with the two thermal contact surfaces, the quantity of the at least one heat dissipating assembly is two, the heat conductive seats of the two heat dissipating assemblies are respectively in thermal contact with the two heat-generating surfaces.

13. The cooling system according to claim 10, wherein the water tank further has at least one second inner outlet and at least one second inner inlet, the at least one second inner outlet corresponds to the first chamber, the at least one second inner inlet corresponds to the second chamber, one end of the at least one pipe is connected to the at least one second inner outlet, and another end of the at least one pipe is connected to the at least one second inner inlet.

14. The cooling system according to claim 13, wherein the quantities of the at least one second inner outlet, the at least one second inner inlet and the at least one pipe are each two.

15. The cooling system according to claim 13, wherein the water tank further has at least one third inner outlet and at least one third inner inlet, the at least one third inner outlet corresponds to the first chamber, the at least one third inner inlet corresponds to the second chamber, the quantity of the at least one heat dissipating assembly is two, two opposite ends of the pipe of one of the two heat dissipating assemblies are respectively connected to the second inner outlet and the second inner inlet, two opposite ends of the pipe of the other heat dissipating assembly are respectively connected to the at least one third inner outlet and the at least one third inner inlet.

16. The cooling system according to claim 13, wherein the quantities of the at least one second inner outlet, the at least one second inner inlet, the at least one third inner outlet, the at least one third inner inlet and the at least one pipe of the at least one heat dissipating assembly are each two.

17. The cooling system according to claim 10, further comprising a rear plate and two connecting components, the cold end chamber body, the at least one thermoelectric chip and the at least one heat dissipating assembly being located between the water tank and the rear plate, the two connecting components being respectively connected to two opposite sides of the water tank and being respectively connected to two opposite sides of the rear plate.

18. The cooling system according to claim 17, further comprising two side plates which are respectively connected to the two connecting components, and the two side plates being respectively connected to two opposite sides of the rear plate.

\* \* \* \* \*